(12) United States Patent
Ko

(10) Patent No.: US 12,417,971 B2
(45) Date of Patent: Sep. 16, 2025

(54) SEMICONDUCTOR PACKAGE WITH MULTILAYER BONDING PADS

(71) Applicant: Samsung Electronics Co., Ltd., Suwon-si (KR)

(72) Inventor: Daae Ko, Cheonan-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 450 days.

(21) Appl. No.: 17/878,142

(22) Filed: Aug. 1, 2022

(65) Prior Publication Data

US 2023/0163060 A1 May 25, 2023

(51) Int. Cl.
*H01L 23/498* (2006.01)
*H01L 21/48* (2006.01)
*H01L 23/00* (2006.01)

(52) U.S. Cl.
CPC .... *H01L 23/49838* (2013.01); *H01L 21/4857* (2013.01); *H01L 21/486* (2013.01); *H01L 23/49816* (2013.01); *H01L 23/49822* (2013.01); *H01L 23/49894* (2013.01); *H01L 24/42* (2013.01); *H01L 24/48* (2013.01); *H01L 24/85* (2013.01); *H01L 21/4853* (2013.01); *H01L 2224/05007* (2013.01); *H01L 2224/05009* (2013.01); *H01L 2224/48229* (2013.01)

(58) Field of Classification Search
CPC ......... H01L 23/49838; H01L 23/49822; H01L 23/49866; H01L 21/4853; H01L 21/4857; H01L 24/85; H01L 24/42–49; H01L 2224/04042; H01L 2224/05007–05009; H01L 2224/05547–05548; H01L 2224/48227–48229; H01L 2224/05082; H01L 2224/05083–84; H01L 2224/13082–13084; H01L 2224/05075
See application file for complete search history.

(56) References Cited

U.S. PATENT DOCUMENTS 6,278,180 B1 * 8/2001 Mizushima ......... H01L 23/3128
257/E21.511
8,049,325 B2 11/2011 Mu-Seob et al.
(Continued)

FOREIGN PATENT DOCUMENTS

KR 100547349 B1 1/2006
KR 100674305 B1 1/2007
(Continued)

*Primary Examiner* — Wael M Fahmy
*Assistant Examiner* — Aneesa R Baig
(74) *Attorney, Agent, or Firm* — Muir Patent Law, PLLC

(57) ABSTRACT

A semiconductor device includes a substrate that includes an upper protection layer and a plurality of upper bonding pads, a semiconductor chip on the substrate, and a plurality of bonding wires connected to the semiconductor chip and the upper bonding pads. Each of the upper bonding pads includes a first conductive pattern, a second conductive pattern that covers a top surface and a sidewall of the first conductive pattern and includes a metal element the same as a metal element of the first conductive pattern, and a bonding layer on the second conductive pattern. A width at the top surface of the first conductive pattern is less than a width at a bottom surface of the first conductive pattern. The upper protection layer covers sidewalls of the second conductive pattern.

20 Claims, 11 Drawing Sheets

(56) References Cited

U.S. PATENT DOCUMENTS

| | | | |
|---|---|---|---|
| 10,872,786 B2 | 12/2020 | Cho et al. | |
| 2003/0214038 A1* | 11/2003 | Nemoto | H01L 24/03 |
| | | | 257/E21.174 |
| 2005/0258484 A1* | 11/2005 | Itou | H01L 24/05 |
| | | | 257/341 |
| 2007/0111491 A1 | 5/2007 | Hsu | |
| 2009/0115036 A1 | 5/2009 | Shin | |
| 2014/0284790 A1* | 9/2014 | Matsumoto | H01L 24/06 |
| | | | 257/737 |
| 2015/0194397 A1* | 7/2015 | Jeng | H01L 24/03 |
| | | | 438/652 |
| 2017/0092605 A1* | 3/2017 | Tonegawa | H10D 12/038 |
| 2017/0141065 A1* | 5/2017 | Murai | H01L 24/14 |
| 2020/0126919 A1* | 4/2020 | Kang | H01L 23/16 |
| 2022/0173025 A1* | 6/2022 | Lee | H01L 23/49822 |
| 2022/0189865 A1* | 6/2022 | Ko | H01L 23/49838 |
| 2023/0163060 A1* | 5/2023 | Ko | H01L 23/49827 |
| | | | 257/784 |

FOREIGN PATENT DOCUMENTS

| | | |
|---|---|---|
| KR | 100843705 B1 | 7/2008 |
| KR | 1020090011932 A | 2/2009 |
| KR | 101544508 B1 | 8/2015 |

* cited by examiner

SEMICONDUCTOR PACKAGE WITH MULTILAYER BONDING PADS

CROSS-REFERENCE TO RELATED APPLICATION

This U.S. nonprovisional application claims priority under 35 U.S.C § 119 to Korean Patent Application No. 10-2021-0161354 filed on Nov. 22, 2021 in the Korean Intellectual Property Office, the disclosure of which is hereby incorporated by reference in its entirety.

BACKGROUND

The present inventive concepts relate to a semiconductor package, and more particularly, to a semiconductor package including bonding pads.

A semiconductor package is provided to implement an integrated circuit chip to qualify for use in electronic products. A semiconductor package may be fabricated by mounting a semiconductor chip on a package substrate, and then using bonding wires or bumps to electrically connect the semiconductor chip to the package substrate. For example, a printed circuit board (PCB) may be used as the package substrate. With the development of the electronics industry, various research has been conducted to improve reliability and durability of semiconductor packages.

SUMMARY

Some embodiments of the present inventive concepts provide a compact-sized semiconductor package.

Some embodiments of the present inventive concepts provide a semiconductor package with improved electrical properties and increased reliability.

According to some embodiments of the present inventive concepts, a semiconductor package may comprise: a substrate that includes an upper protection layer and a plurality of upper bonding pads; a semiconductor chip on the substrate; and a plurality of bonding wires connected to the semiconductor chip and the upper bonding pads. Each of the upper bonding pads may include: a first conductive pattern; a second conductive pattern that covers a top surface and a sidewall of the first conductive pattern and includes a metal element the same as a metal element of the first conductive pattern; and a bonding layer on the second conductive pattern. A width at the top surface of the first conductive pattern may be less than a width at a bottom surface of the first conductive pattern. The upper protection layer may cover sidewalls of the second conductive pattern.

According to some embodiments of the present inventive concepts, a semiconductor package may comprise a substrate that includes an upper protection layer and an upper bonding pad. The upper bonding pad may include: a first conductive pattern; a second conductive pattern on the first conductive pattern; and a bonding layer on the second conductive pattern. A width at a top surface of the first conductive pattern may be less than a width at a bottom surface of the first conductive pattern. The second conductive pattern may cover a sidewall and the top surface of the first conductive pattern. A width at a top surface of the second conductive pattern may be about 90% to about 110% of the width at the bottom surface of the first conductive pattern. The upper protection layer may cover sidewalls of the second conductive pattern.

According to some embodiments of the present inventive concepts, a semiconductor package may comprise: a substrate, wherein the substrate includes, a dielectric structure that includes a plurality of stacked dielectric layers, a wiring line between the dielectric layers, a lower pad disposed on a bottom surface of the dielectric structure and electrically connected to the wiring line, an upper bonding pad disposed on a top surface of the dielectric structure and electrically connected to the wiring line, and an upper protection layer on the top surface of the dielectric structure; a solder ball on a bottom surface of the lower pad; a semiconductor chip on a top surface of the substrate; a bonding wire connected to the semiconductor chip and the upper bonding pad; and a molding layer on the substrate, the molding layer covering the semiconductor chip and the bonding wire. The upper bonding pad may include: a first conductive pattern; a second conductive pattern on a top surface of the first conductive pattern, the second conductive pattern including a first metal element the same as a metal element of the first conductive pattern; an intermediate layer on a top surface of the second conductive pattern, the intermediate layer including a second metal element different from the first metal element; and a bonding layer on a top surface of the intermediate layer, the bonding layer including a third metal element different from the first metal element and different from the second metal element. A width at the top surface of the first conductive pattern may be less than a width at a bottom surface of the first conductive pattern. The upper protection layer may cover a sidewall of the second conductive pattern.

DETAIL DESCRIPTION

Figure 1:
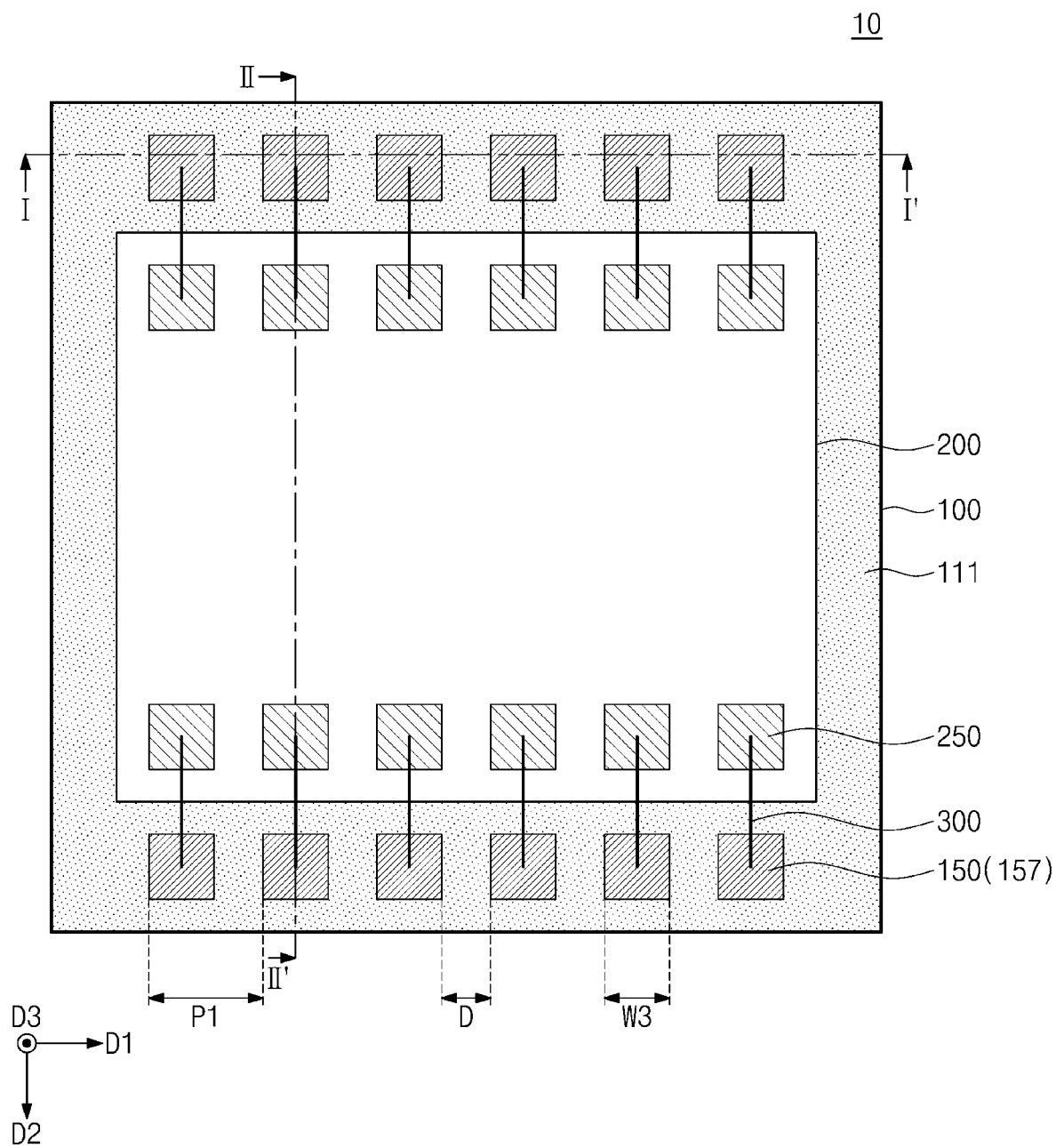
FIG. 1 illustrates a plan view showing a semiconductor package according to some embodiments.

In this description, like reference numerals may indicate like components. The following will describe a substrate, a semiconductor package including the same, and a substrate fabrication method according to embodiments of the present inventive concepts.

FIG. 1 illustrates a plan view showing a semiconductor package according to some embodiments.

Referring to FIG. 1, a semiconductor package 10 may include a substrate 100, a semiconductor chip 200, and bonding wires 300. The substrate 100 may be a printed circuit board (PCB), but the present inventive concepts are not limited thereto. When viewed in plan view, the substrate 100 may have a central region and an edge region. The edge region of the substrate 100 may be provided between the central region of the substrate 100 and a lateral surface (e.g., four lateral surfaces) of the substrate 100. The edge region of the substrate 100 may be between lateral side surfaces of the semiconductor chip 200 and respective lateral side surfaces of the substrate 100. The substrate 100 may include upper bonding pads 150 and an upper protection layer 111. When viewed in plan view, the upper bonding pads 150 may overlap the edge region of the substrate 100. The upper protection layer 111 may expose top surfaces of the upper bonding pads 150. The upper bonding pads 150 may be aligned along a first direction D1 and spaced apart from each other in the first direction D1. The first direction D1 may be parallel to a top surface of the upper protection layer 111. A second direction D2 may be parallel to the top surface of the upper protection layer 111 and substantially orthogonal to the first direction D1. A third direction D3 may be substantially perpendicular to the top surface of the upper protection layer 111 and substantially vertical to the first and second directions D1 and D2. Terms such as "parallel," "perpendicular," "same," "equal," "planar," and "coplanar," as used herein encompass identicality or near identicality including variations that may occur, for example, due to manufacturing processes that fall within allowable tolerances. The term "substantially" may be used herein to emphasize this meaning, unless the context or other statements indicate otherwise. A top surface of the substrate 100 may include the top surfaces of the upper bonding pads 150 and the top surface of the upper protection layer 111.

The semiconductor chip 200 may be mounted on the top surface of the substrate 100. For example, when viewed in plan view, the semiconductor chip 200 may overlap the central region of the substrate 100. In some embodiments, the semiconductor chip 200 may be a memory chip, such as DRAM, SRAM, or NAND Flash. The semiconductor chip 200 may include chip pads 250. The chip pads 250 may be provided on a top surface of the semiconductor chip 200. The chip pads 250 may be electrically connected to integrated circuits of the semiconductor chip 200. The phrase "a certain component is electrically connected to the semiconductor chip 200" may mean that "the certain component is electrically connected to the integrated circuits through the chip pads 250 of the semiconductor chip 200." The expression "two components are electrically connected to each other" may include the meaning that "two components are connected to pass electrical signals from one component to the other either by being directly physically connected to each other or by being indirectly physically connected to each other through other component(s)." The chip pads 250 may include or be formed of a conductive material, such as metal. Though only one chip 200 is shown, in some embodiments, the chip 200 may be part of a stack of chips electrically connected to the substrate 100.

The bonding wires 300 may be provided on the semiconductor chip 200 and the substrate 100. The bonding wires 300 may be electrically connected to the chip pads 250 and the upper bonding pads 150. The semiconductor chip 200 may be electrically connected through the bonding wires 300 to the substrate 100. The bonding wires 300 may include metal, such as gold (Au).

The following will describe in detail a substrate.

Figure 2A:
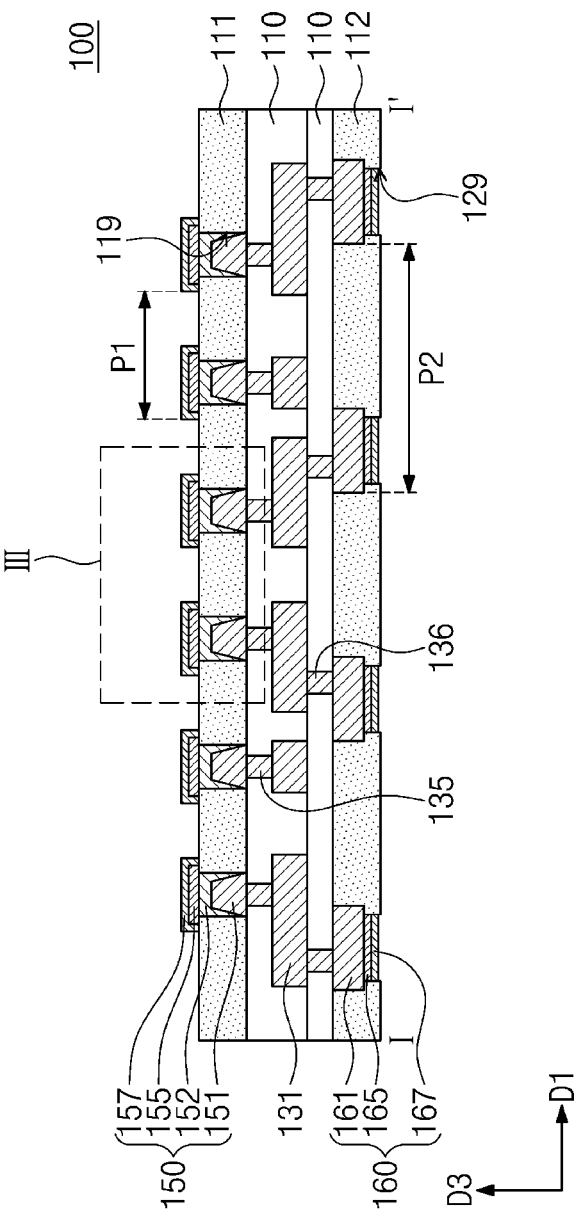
FIG. 2A illustrates a cross-sectional view showing a substrate according to some embodiments.
Figure 2B:
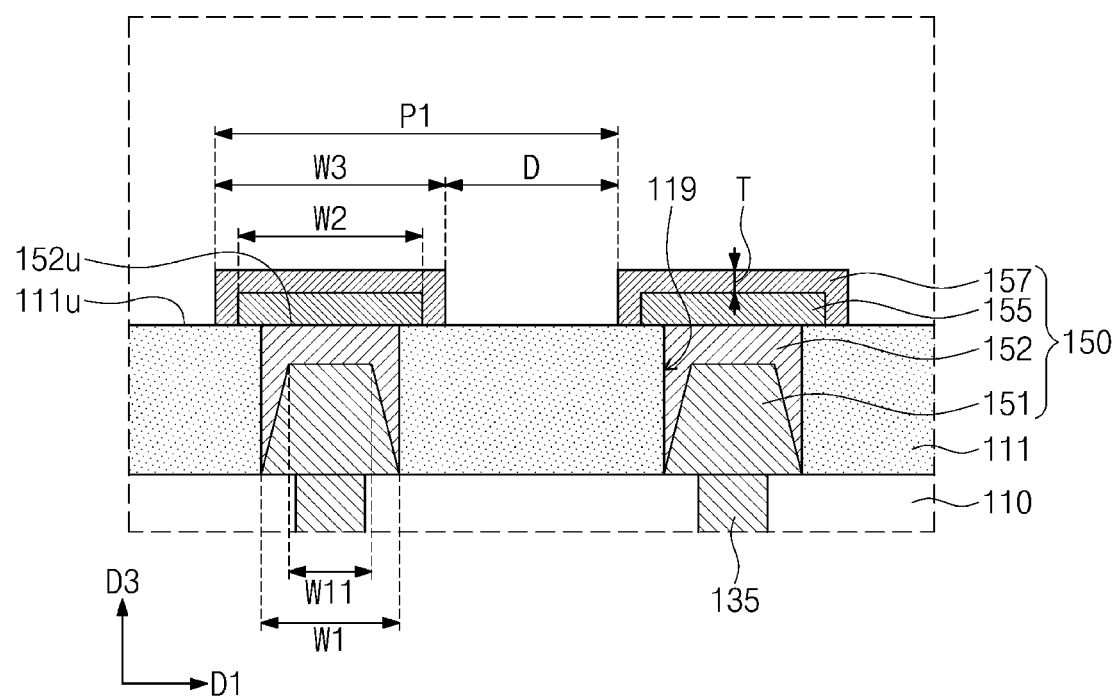
FIG. 2B illustrates an enlarged view showing section III of FIG. 2A.

FIG. 2A illustrates a cross-sectional view taken along line I-I' of FIG. 1, showing a substrate according to some embodiments. FIG. 2B illustrates an enlarged view showing section III of FIG. 2A.

Referring to FIGS. 1, 2A, and 2B, the substrate 100 may include a dielectric structure, wiring lines 131, first conductive vias 135, second conductive vias 136, upper bonding pads 150, a lower protection layer 112, and lower pads 160. The dielectric structure may include a plurality of stacked dielectric layers 110. The dielectric layers 110 may include or be formed of, for example, prepreg. The wiring lines 131 may be provided between the dielectric layers 110. The wiring line 131 may include or be formed of metal, such as copper. The first and second conductive vias 135 and 136 may penetrate the dielectric layers 110. The first conductive vias 135 may be provided on top surfaces of the wiring lines 131, for example, to contact the wiring lines 131 at a top surface of the wiring lines 131. The second conductive vias 136 may be provided on bottom surfaces of the wiring lines 131, for example, to contact the wiring lines 131 at a bottom surface of the wiring lines 131. The first and second conductive vias 135 and 136 may include or be formed of metal, such as copper. It will be understood that when an element is referred to as being "on" or "connected" or "coupled" to another element, it can be directly on or connected or coupled to the other element or intervening elements may be present. In contrast, when an element is referred to as being "directly connected" or "directly coupled" to another element, or as "contacting" or "in contact with" another element, there are no intervening elements present at the point of contact. Other words used to describe the relationship between elements should be interpreted in a like fashion (e.g., "between" versus "directly between," "adjacent" versus "directly adjacent," etc.).

The upper protection layer 111 may be provided on a top surface of an uppermost one of the dielectric layers 110. The top surface of the uppermost dielectric layer 110 may be a top surface of the dielectric structure. The upper protection layer 111 may have first holes 119, or openings, that penetrate therethrough. The first holes 119 may expose the first conductive vias 135. The upper protection layer 111 may include or be formed of an organic dielectric material, such as a solder resist material.

The upper bonding pads 150 may be provided on the top surface of the uppermost dielectric layer 110. The upper bonding pads 150 may be correspondingly provided in the first holes 119. Each of the upper bonding pads 150 may include a first portion formed in the hole 119 and including a first conductive pattern 151 and a second conductive pattern 152, and a second portion formed outside of the hole 119 and including an intermediate layer 155 and a bonding layer 157. The first conductive pattern 151 may be provided on the uppermost dielectric layer 110 and the first conductive via 135 that corresponds to the first conductive pattern 151 (e.g., formed directly on the structure formed of the uppermost dielectric layer 110 and the first conductive via 135. As illustrated in FIG. 2B, the first conductive pattern 151 may have a first width W1, e.g., in the D1 direction, at a bottom surface thereof. The first width W1 may be in range from about 17 μm to about 30 μm. Because the first width W1 is equal to or less than about 30 μm, an electrical short may be prevented between the upper bonding pads 150. The first conductive pattern 151 may have a trapezoidal shape. For example, the first conductive pattern 151 may have, at a top surface thereof, a width W11 less than the first width W1. A sidewall of the first conductive pattern 151 may be inclined relative to the bottom surface of the first conductive pattern 151. Though not shown from the direction depicted in FIGS. 2A and 2B, the sidewall may have a curved shape (e.g., a circular shape), from a plan view, or may have four sides connected at edges (e.g., to have a square shape), from a plan view. The first conductive pattern 151 may include or be formed of a first metal element. The first metal element may include or may be, for example, copper. Terms such as "about" or "approximately" may reflect amounts, sizes, orientations, or layouts that vary only in a small relative manner, and/or in a way that does not significantly alter the operation, functionality, or structure of certain elements. For example, a range having ends of different orders of magnitude (e.g., from "about 0.1 to about 1") may encompass a range such as a 0%-5% deviation around each end (e.g., a 0% to 5% deviation around 0.1 and a 0% to 5% deviation around 1), while a range having ends of the same order of magnitude (e.g., about 15 to about 30) may encompass a range such as a 0%-5% deviation around the smaller of the two ends, particularly where the above deviations maintain the same effect as the listed range.

The second conductive pattern 152 may be provided on the first conductive pattern 151. For example, the second conductive pattern 152 may cover the top surface and the sidewall of the first conductive pattern 151. Though not shown from the direction depicted in FIGS. 2A and 2B, the sidewall may have a curved shape, from a plan view, or may have four sides connected at edges, from a plan view. The second conductive pattern 152, as measured between opposite outer sidewalls in the D1 direction, may have a uniform width. The second conductive pattern 152 may have the first width W1. The first width W1 may be a width at a top surface 152u of the second conductive pattern 152. The second conductive pattern 152 may have a sidewall that is substantially vertical. For example, a substantially right angle may be given as an angle between the sidewall of the second conductive pattern 152 and a bottom surface of the upper protection layer 111. In this description, the term "vertical" may indicate the meaning of "parallel to the third direction." The first and second conductive patterns 151 and 152 may be described as first and second conductive components or first and second conductive portions, respectively.

The width at the top surface 152u of the second conductive pattern 152 may be the same as or similar to the first width W1, for example, about 90% to about 110% of the first width W1. The width at the top surface 152u of the second conductive pattern 152 may be in a range, for example, from about 17 μm to about 30 μm. The top surface 152u of the second conductive pattern 152 may be located at substantially the same level as that of a top surface 111u of the upper protection layer 111 to be coplanar with the top surface 111u of the upper protection layer 111, but the present inventive concepts are not limited thereto. A level of a certain component may indicate a vertical level.

The sidewall of the second conductive pattern 152 may be covered with the upper protection layer 111. For example, the sidewall of the second conductive pattern 152 may contact the upper protection layer 111.

The second conductive pattern 152 may include a first metal element the same as that of the first conductive pattern 151. According to some embodiments, the second conductive pattern 152 may have a grain different from that of the first conductive pattern 151, for example, such that a grain boundary is formed between the first conductive pattern 151 and the second conductive pattern 152. For example, the grain of the second conductive pattern 152 may have a size different from that of the grain of the first conductive pattern 151. For another example, the grain of the second conductive pattern 152 may have a shape different from that of the grain of the first conductive pattern 151. For another example, the grain of the second conductive pattern 152 may have a crystal structure different from that of the grain of the first conductive pattern 151. According to some embodiments, the second conductive pattern 152 may have the same grain as that of the first conductive pattern 151.

The intermediate layer 155 may be provided on the top surface 152u of the second conductive pattern 152. For example, the intermediate layer 155 may cover the top surface 152u of the second conductive pattern 152. The intermediate layer 155 may include or be formed of a second metal element. The second metal element may be different from the first metal element. The second metal element may include or be, for example, nickel. A width of a the intermediate layer 155 may be, for example, W2, which may be greater than W1 by, for example, up to about 20%. The width W2 may be a width in the D1 direction of both a bottom surface and a top surface of the intermediate layer 155. The intermediate layer 155 may have sidewall surfaces that extend between top and bottom surfaces and are substantially vertical.

The bonding layer 157 may be provided on the intermediate layer 155. The bonding layer 157 may cover a top surface and sidewalls of the intermediate layer 155. The top surface of the bonding layer 157 may be a surface to which the bonding wire (see 300 of FIG. 1 or 2A) is bonded. The bonding layer 157 may have a third width W3. The third width W3 may be a width at the top surface of the bonding layer 157. The third width W3 may be in a range from about 20 μm to about 33 μm. When the third width W3 is less than about 20 μm, the bonding wire 300 may be difficult to bond to the bonding layer 157. According to some embodiments, because the third width W3 is equal to or greater than about 20 μm, the bonding wire 300 may be adequately bonded to the bonding layer 157 even when process errors occur in a process for forming the bonding wire 300. When the third width W3 is greater than about 33 μm, a pitch P1 of the upper bonding pads 150 may need to be increased, for example, to avoid short circuits between adjacent upper bonding pads 150. According to some embodiments, because the third width W3 is equal to or less than about 33 μm, the pitch P1 of the upper bonding pads 150 may become reduced. Accordingly, the semiconductor package 10 may become high in integration and small in size.

The third width W3 may be the same as or greater than the second width W2, and may be greater than the first width W1. For example, the third width W3 may be about 100% to about 120% of the first width W1 while being greater than the second width W2. If the second width W2 and the third width W3 are less than the first width W1, the second conductive pattern 152 may be exposed and damaged. According to some embodiments, because the third width W3 is equal to or greater than about 100% of the first width W1, the bonding layer 157 combined with the intermediate layer 155 may completely cover the top surface 152u of the second conductive pattern 152. Therefore, the second conductive pattern 152 may be prevented from being damaged. Because the third width W3 is equal to or less than about 120% of the first width W1, the upper bonding pads 150 may have a fine pitch P1.

The bonding layer 157 may have a thickness (e.g., in a vertical direction on the top surface of the intermediate layer 155 and in a horizontal direction on the sidewall surface of the intermediate layer 155) of about 2 μm to about 5 μm. Because the thickness T of the bonding layer 157 is equal to or greater than about 2 μm, the bonding wire 300 may be adequately bonded to the bonding layer 157. There may be an improvement in bonding reliability between the bonding layer 157 and the bonding wire 300. Because the thickness T of the bonding layer 157 is equal to or less than about 5 µm, the upper bonding pads 150 may have a reduced interval D therebetween, and the upper bonding pads 150 may have a fine pitch P1. The bonding layer 157 may have a substantially uniform thickness T. For example, the thickness T of the bonding layer 157 on the top surface of the intermediate layer 155 may be substantially the same as the thickness T of the bonding layer 157 on the sidewalls of the intermediate layer 155. The thickness T of the bonding layer 157 may have a deviation equal to or less than about 1.5 µm. Accordingly, an electrical short may be prevented between the upper bonding pads 150.

The bonding layer 157 may include or be formed of a third metal element. The third metal element may be different from the first metal element and the second metal element. For example, the third metal element may include or may be gold (Au). In the formation of the bonding layer 157, the intermediate layer 155 may assist in plating the bonding layer 157. The intermediate layer 155 may serve as a metal adhesion layer to allow the bonding layer to adequately bond to the second conductive pattern 152. The bonding layer 157 may further serve as a protection layer. For example, the bonding layer 157 may prevent damage (e.g., oxidation) of the intermediate layer 155 and second conductive pattern 152.

The pitch P1 in the D1 direction of the upper bonding pads 150, or distance between corresponding points of adjacent upper bonding pads 150, may be a fine pitch. For example, the pitch P1 of the upper bonding pads 150 may be in a range of about 40 µm to about 60 µm. Because the pitch P1 of the upper bonding pads 150 is equal to or greater than about 40 µm, an electrical short may be prevented between the upper bonding pads 150 and/or between the bonding wires 300. Because the pitch P1 of the upper bonding pads 150 is equal to or less than about 60 µm, the semiconductor package 10 may become small in size and high in integration.

The upper bonding pads 150 may have an interval D, or closest distance between them, of about 10 µm to about 20 µm. The interval D between the upper bonding pads 150 may correspond to an interval between the bonding layers 157 that correspond to the upper bonding pads 150. Because the interval D between the upper bonding pads 150 is equal to or greater than about 10 µm, an electrical short may be prevented between the upper bonding pads 150 and/or between the bonding wires 300. Because the interval D between the upper bonding pads 150 is equal to or greater than about 20 µm, the semiconductor package 10 may become small in size and high in integration.

As the first and second conductive patterns 151 and 152 included in one upper bonding pad 150 are provided in corresponding first holes 119, a plurality of neighboring second conductive patterns 152 may be disposed laterally spaced apart from each other. Accordingly an electrical short may be prevented between the plurality of neighboring second conductive patterns 152.

When the upper bonding pads 150 do not include the second conductive patterns 152, and do not include the intermediate layer 155 or bonding layer 157 as shown in FIG. 2B, the first conductive pattern 151 may be required to have an increased size (and the hole 119 may need to be bigger) to satisfy the condition that the third width W3 of a bonding layer of upper bonding pads is in a range of about 20 µm to about 33 µm. In this case, the first conductive pattern 151 may have an increased width at the bottom surface thereof, and thus an electrical short may occur between the upper bonding pads 150. Alternatively, there may need to be an increase in the pitch P1 of the upper bonding pads 150. According to some embodiments, because the upper bonding pads 150 include the second conductive patterns 152, the first conductive pattern 151 may have a reduced size, and the second width W2 may be relatively small. Therefore, an electric short may be prevented between the upper bonding pads 150, and the interval D may be reduced between the upper bonding pads 150. Accordingly, the pitch P1 may be reduced between the upper bonding pads 150. For brevity of description, the following will discuss a single second conductive pattern 152.

Referring back to FIG. 2A, the lower protection layer 112 may be provided on a bottom surface of a lowermost one of the dielectric layers 110. The bottom surface of the lowermost dielectric layer 110 may be a bottom surface of the dielectric structure. The lower protection layer 112 may have second holes 129 that penetrate therethrough. The second holes 129 may expose second conductive vias 136. The lower protection layer 112 may include or be formed of a dielectric material, such as a solder resist material.

The lower pads 160 may be provided on the top surface of the lowermost dielectric layer 110. The lower pads 160 may be provided in the second hole 129. Each of the lower pads 160 may include a lower conductive pattern 161, a lower intermediate layer 165, and a lower bonding layer 167. The lower conductive pattern 161 may be provided on the bottom surface of the lowermost dielectric layer 110 and a bottom surface of the second conductive via 136 that corresponds to the lower conductive pattern 161. A shape of the second conductive pattern 152 may be variously changed. The second conductive pattern 152 may include or be formed of the first metal element.

The lower intermediate layer 165 may be provided on a bottom surface of the lower conductive pattern 161. The lower intermediate layer 165 may have a width the same as or less than that of the lower conductive pattern 161. The lower intermediate layer 165 may include or be formed of the second metal element.

The lower bonding layer 167 may be provided on the bottom surface of the lower intermediate layer 165. The lower bonding layer 167 may have a bottom surface to which a solder ball (see 600 of FIG. 3A) is bonded. The lower bonding layer 167 may include or be formed of the third metal element. The lower protection layer 112 may cover a sidewall of the lower conductive pattern 161, a sidewall of the lower intermediate layer 165, and a sidewall of the lower bonding layer 167.

The lower pads 160 may have a pitch P2 greater than the pitch P1 of the upper bonding pads 150.

Alternatively, each of the lower pads 160 may include neither the lower intermediate layer 165 nor the lower bonding layer 167. In this case, each of solder balls (see 600 of FIG. 3A) may be directly disposed on the bottom surface of a corresponding lower conductive pattern 161.

The lower pads 160 may be electrically connected to the upper bonding pads 150 through the second conductive vias 136, the wiring lines 131, and the first conductive vias 135.

Figure 2C:
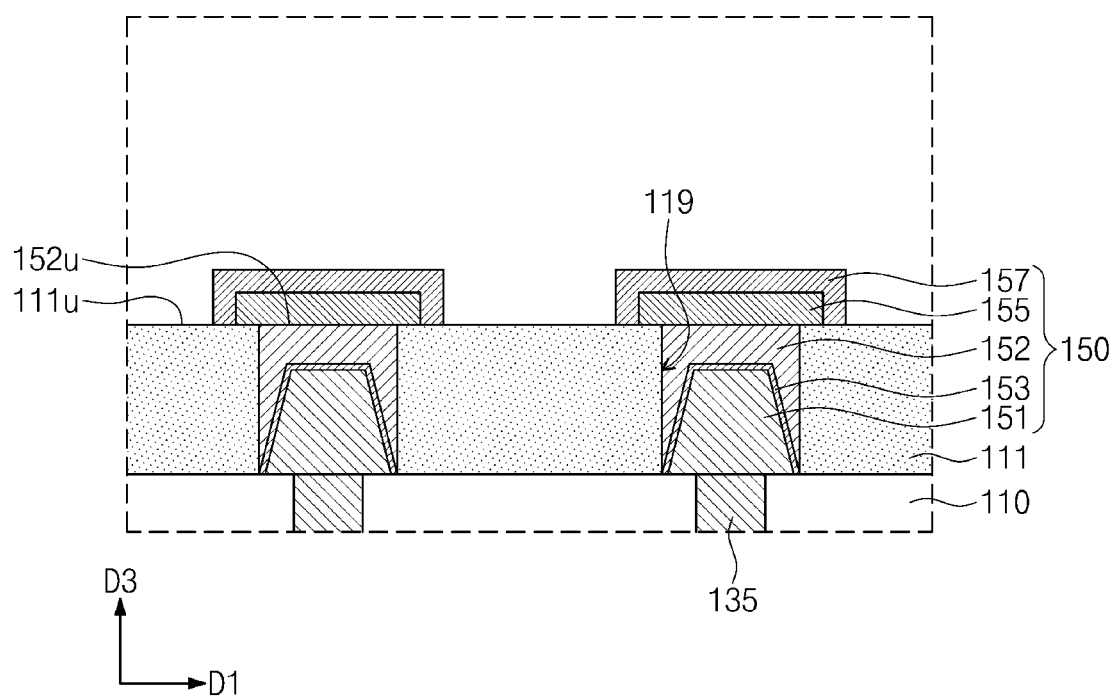
FIG. 2C illustrates a cross-sectional view showing upper bonding pads according to some embodiments.

FIG. 2C illustrates an enlarged view of section III depicted in FIG. 2A, showing upper bonding pads according to some embodiments.

Referring to FIG. 2C, each of the upper bonding pads 150 may include a seed pattern 153 in addition to the first conductive pattern 151, the second conductive pattern 152, the intermediate layer 155, and the bonding layer 157. The seed pattern 153 may be interposed between the first conductive pattern 151 and the second conductive pattern 152. The seed pattern 153 may cover the top surface and the sidewalls of the first conductive pattern 151. The second conductive pattern 152 may be formed by a plating process in which the seed pattern 153 is used as an electrode. The seed pattern 153 may include or be formed of metal the same as the first metal element. Alternatively, the seed pattern 153 may include metal different from the first metal element. For example, the seed pattern 153 may include or may be titanium, copper, or any alloy thereof.

Figure 2D:
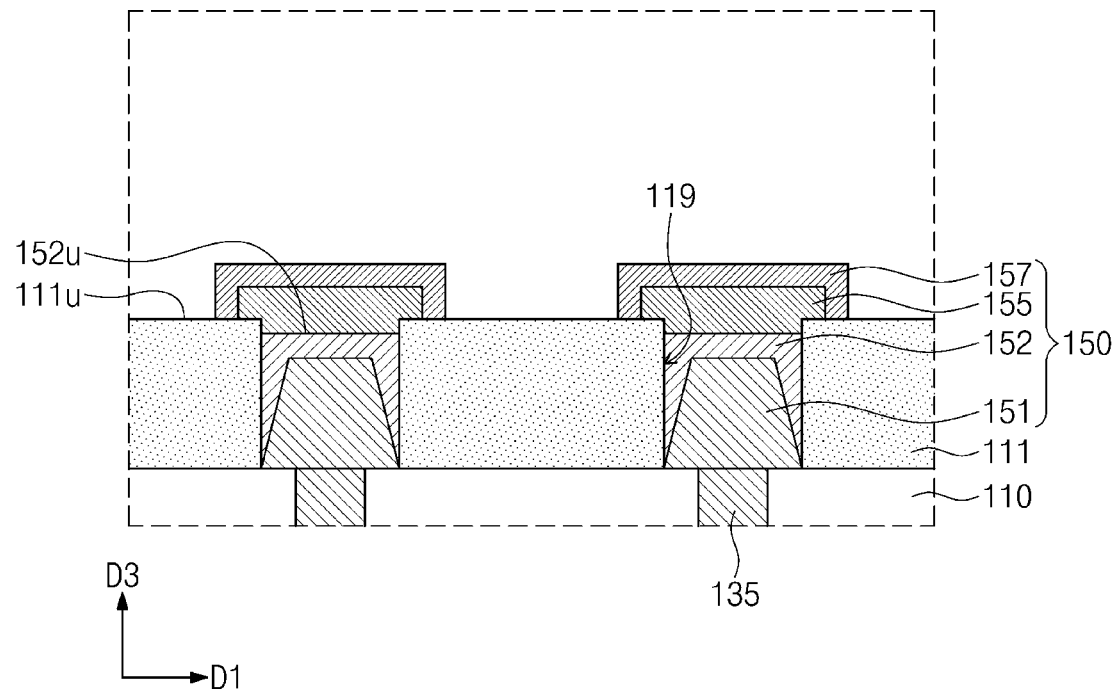
FIG. 2D illustrates a cross-sectional view showing upper bonding pads and an upper protection layer according to some embodiments.
Figure 2E:
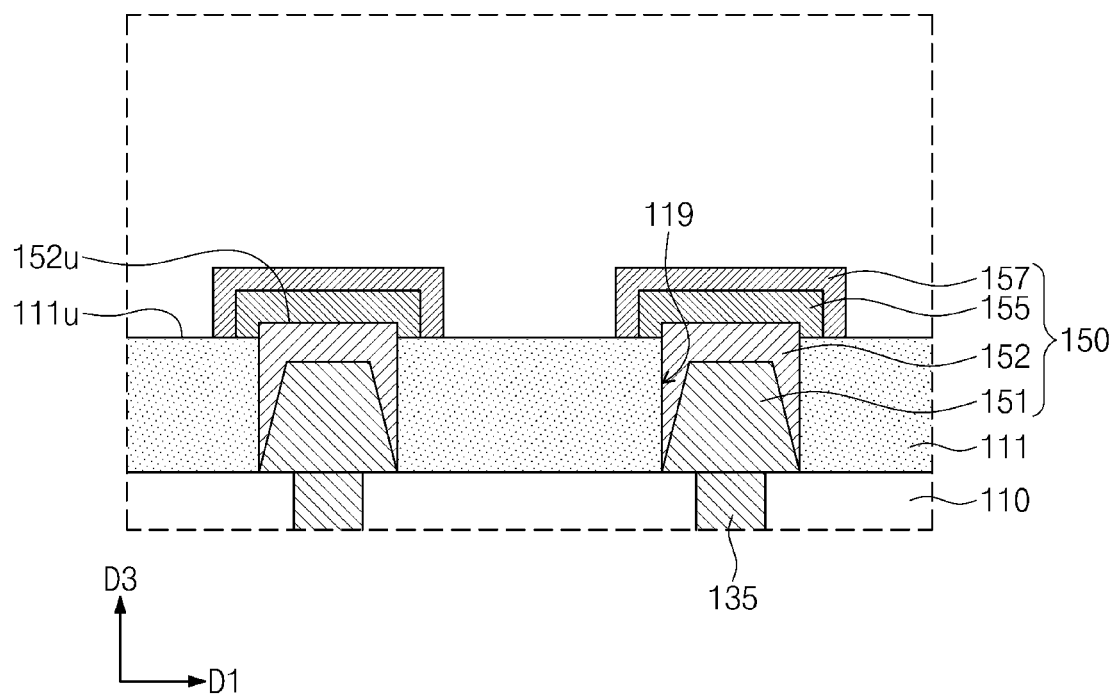
FIG. 2E illustrates a cross-sectional view showing upper bonding pads and an upper protection layer according to some embodiments.

FIGS. 2D and 2E illustrate an enlarged view of section III depicted in FIG. 2A, showing upper bonding pads and an upper protection layer according to some embodiments. A duplicate description will be omitted below.

Referring to FIG. 2D, the top surface 152u of the second conductive pattern 152 may be located at a different level from that of the top surface 111u of the upper protection layer 111. For example, the top surface 152u of the second conductive pattern 152 may be located at a lower level than that of the top surface 111u of the upper protection layer 111. The intermediate layer 155 may be provided in an upper portion of the second hole 129.

Referring to FIG. 2E, the top surface 152u of the second conductive pattern 152 may be located at a higher level than that of the top surface 111u of the upper protection layer 111.

The following will now describe a semiconductor package according to some embodiments.

Figure 3A:
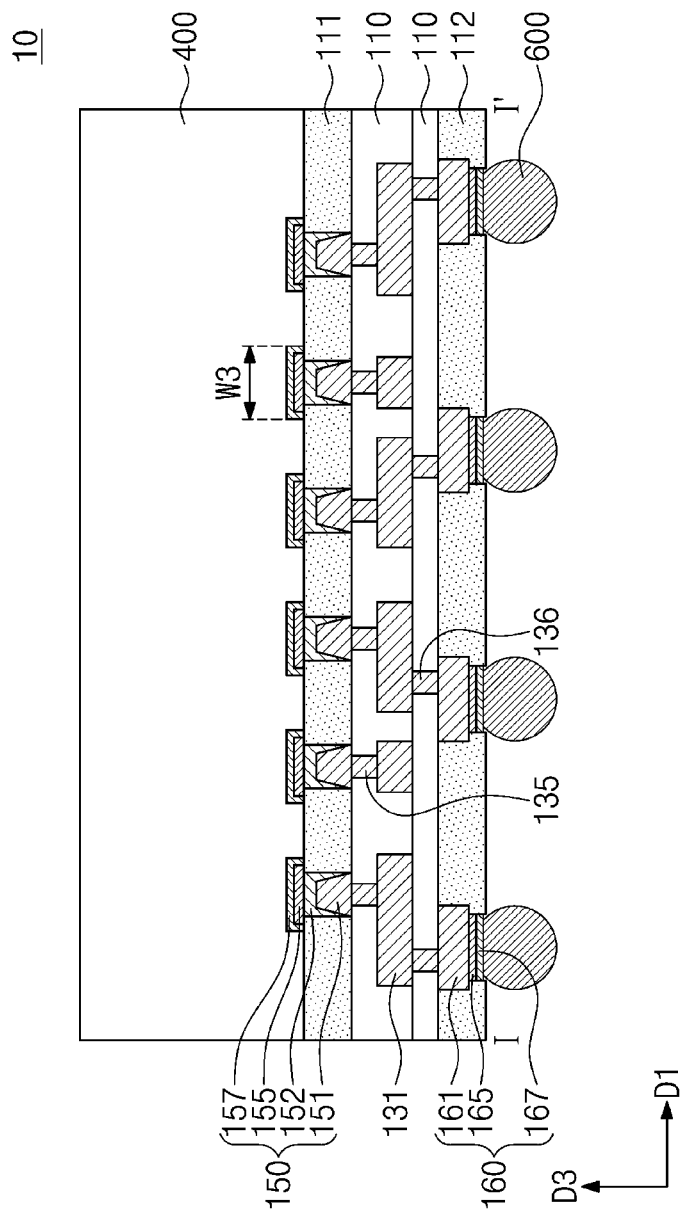
FIG. 3A illustrates a cross-sectional view taken along I-I' of FIG. 1, showing a semiconductor package according to some embodiments.
Figure 3B:
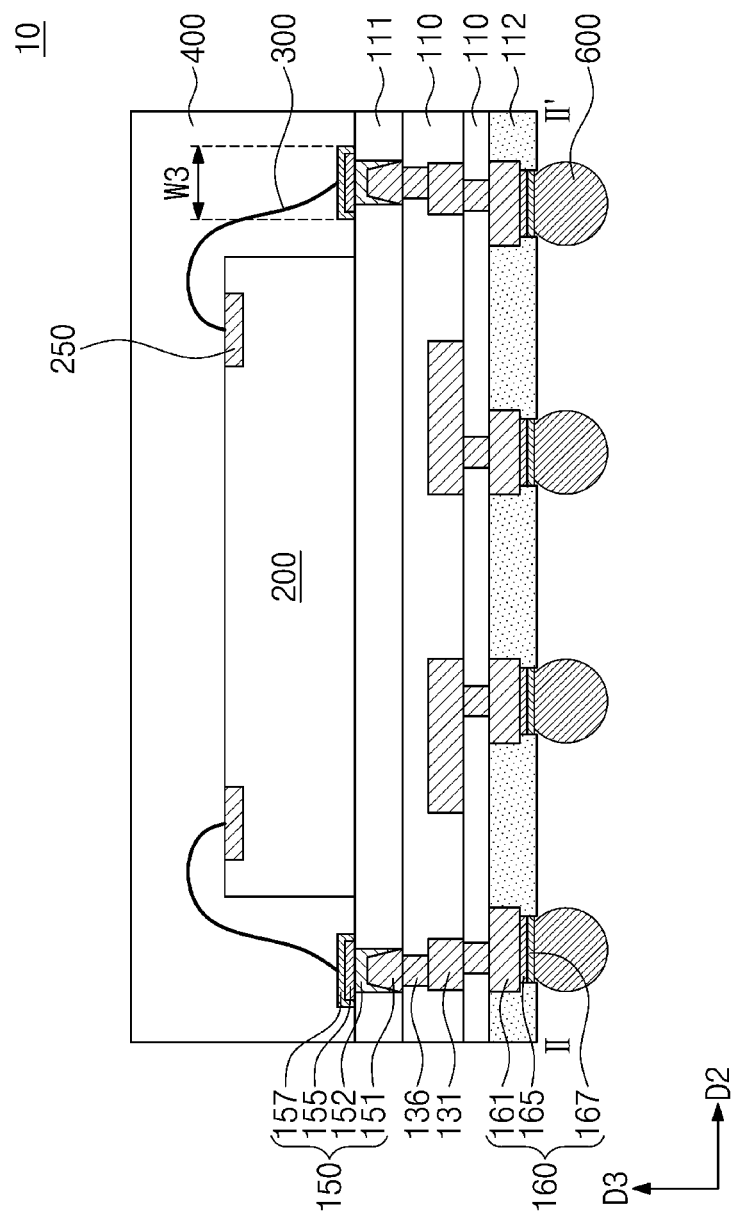
FIG. 3B illustrates a cross-sectional view taken along line II-II' of FIG. 1.

FIG. 3A illustrates a cross-sectional view taken along I-I' of FIG. 1, showing a semiconductor package according to some embodiments. FIG. 3B illustrates a cross-sectional view taken along line II-II' of FIG. 1.

Referring to FIGS. 1, 3A, and 3B, a semiconductor package 10 may include a substrate 100, solder balls 600, a semiconductor chip 200, bonding wires 300, and a molding layer 400. The substrate 100 may be substantially the same as that discussed in the examples of FIGS. 2A to 2E.

The solder balls 600 may be provided on a bottom surface of the substrate 100. For example, the solder balls 600 may be correspondingly provided on bottom surfaces of the lower pads 160. The solder balls 600 may include or be formed of metal, such as a solder material. The solder material may include or be one or more of tin (Sn), silver (Ag), zinc (Zn), and any alloy thereof. The substrate 100 may be electrically connected through the solder balls 600 to an external apparatus. The solder balls 600 therefore may be described as external connection terminals.

As illustrated in FIGS. 1 and 3B, the semiconductor chip 200 may be mounted on a top surface of the substrate 100. The semiconductor chip 200 may include chip pads 250 on the top surface thereof.

According to some embodiments, the bonding wires 300 may be provided on a top surface of the semiconductor chip 200 to electrically connect to the chip pads 250. The bonding wires 300 may be bonded to top surfaces of the upper bonding pads 150. For example, the bonding wire 300 may be correspondingly coupled to the bonding layer 157. As discussed above, because the third width W3 is equal to or greater than about 20 μm, the bonding wire 300 may be adequately bonded to the bonding layer 157 even when process errors occur in a process for forming the bonding wire 300.

It is illustrated that the bonding wires 300 are provided on opposite sidewalls of the semiconductor chip 200, but alternately the bonding wires 300 may be provided on only one sidewall of the semiconductor chip 200. In at least this manner, aspects of the invention may apply to chip stacks including at least a first chip and one or more chips stacked thereon, for example in a step-wise or zig-zag format. For another example, the bonding wires 300 may be provided on at least three sidewalls of the semiconductor chip 200.

As shown in FIG. 3B, and referring back to FIG. 2A, according to some embodiments, upper bonding pads 150 may extend vertically from a lower surface of a single, uppermost insulating layer of a substrate 100 (e.g., a lower surface of upper protection layer 111) through the uppermost insulating layer (e.g., upper protection layer 111). The bottom surface of the bonding pads 150 may have a surface coplanar with a bottom surface of the uppermost insulating layer of the substrate 100 (e.g., upper protection layer 111). The top surface of the bonding pads 150 may have a surface above a top surface of the uppermost insulating layer of the substrate 100. Each upper bonding pad may have a flat top surface and a flat bottom surface. The upper bonding pads 150 may be upper connection terminals, directly adjacent to and contacting bonding wires 300 that connect the substrate 100 to the semiconductor chip 200.

An adhesion layer (not shown) may further be interposed between the semiconductor chip 200 and the substrate 100. The adhesion layer may include or may be a die attach film (DAF).

The molding layer 400 may be provided on the top surface of the substrate 100 to cover the semiconductor chip 200 and the bonding wires 300. The molding layer 400 may include a dielectric polymer, such as an epoxy-based polymer.

The following will describe a substrate fabrication method according to some embodiments.

FIGS. 4A to 4G illustrate cross-sectional views taken along line I-I' of FIG. 1, showing a substrate fabrication method according to some embodiments.

Figure 4A:
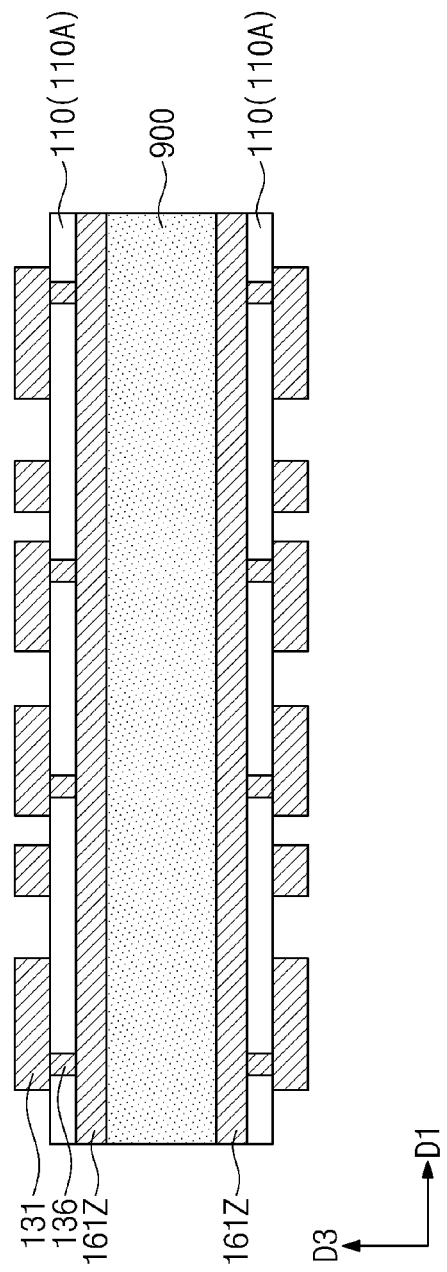
FIGS. 4A to 4G illustrate cross-sectional views showing a substrate fabrication method according to some embodiments.

Referring to FIG. 4A, a temporary substrate 900 may be provided. The temporary substrate 900 may include a detachable core. The temporary substrate 900 may have a top surface and a bottom surface that are opposite to each other.

Second conductive layers 161Z may be formed on the top and bottom surfaces of the temporary substrate 900. Dielectric layers 110 may be correspondingly formed on and cover the second conductive layers 161Z. The dielectric layers 110 may be first dielectric layers 110A. Second conductive vias 136 may be formed in the first dielectric layers 110A to electrically connect to the second conductive layers 161Z. Wiring lines 131 may be correspondingly formed on the second conductive vias 136 and the first dielectric layers 110A. The wiring lines 131 may be spaced apart from each other. The wiring lines 131 may be correspondingly coupled to the second conductive vias 136.

Figure 4B:
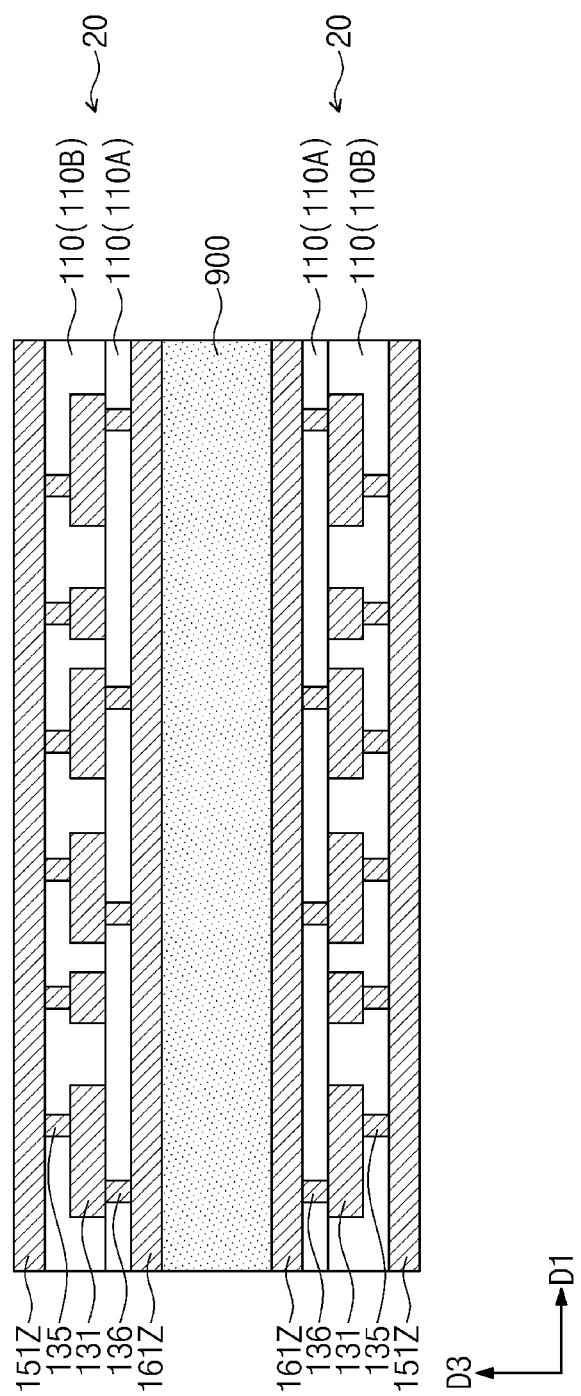

Referring to FIG. 4B, the formation of the dielectric layers 110 may be repeatedly performed to form second dielectric layers 110B. The second dielectric layers 110B may be formed on and cover the first dielectric layers 110A and the wiring lines 131. First conductive vias 135 may be formed in the second dielectric layers 110B and on the wiring lines 131. The first conductive vias 135 may be electrically connected to the wiring lines 131.

First conductive layers 151Z may be formed on the second dielectric layers 110B and the first conductive vias 135. The formation of the first conductive layers 151Z may include performing a plating process. The plating process may include an electroplating process or a chemical plating process. The chemical plating process may include an electroless plating process. The first conductive layers 151Z may be coupled to the first conductive vias 135. Therefore, preliminary substrates 20 may be fabricated. The preliminary substrates 20 may be correspondingly formed on the top and bottom surfaces of the temporary substrate 900.

Each of the preliminary substrates 20 may include a corresponding first dielectric layer 110A, a corresponding second dielectric layer 110B, a corresponding second conductive layer 161Z, first conductive vias 135, a corresponding first conductive layer 151Z, and second conductive vias 136.

Differently from the discussion of FIGS. 4A and 4B, the first conductive layers 151Z may be correspondingly formed on top and bottom surfaces of the temporary substrate 900. Afterwards, a plurality of second dielectric layers 110B, a plurality of first conductive vias 135, a plurality of first dielectric layers 110A, a plurality of second conductive vias 136, a plurality of first dielectric layers 110A, and a plurality of second conductive layers 161Z may be sequentially formed to form the preliminary substrates 20.

Figure 4C:
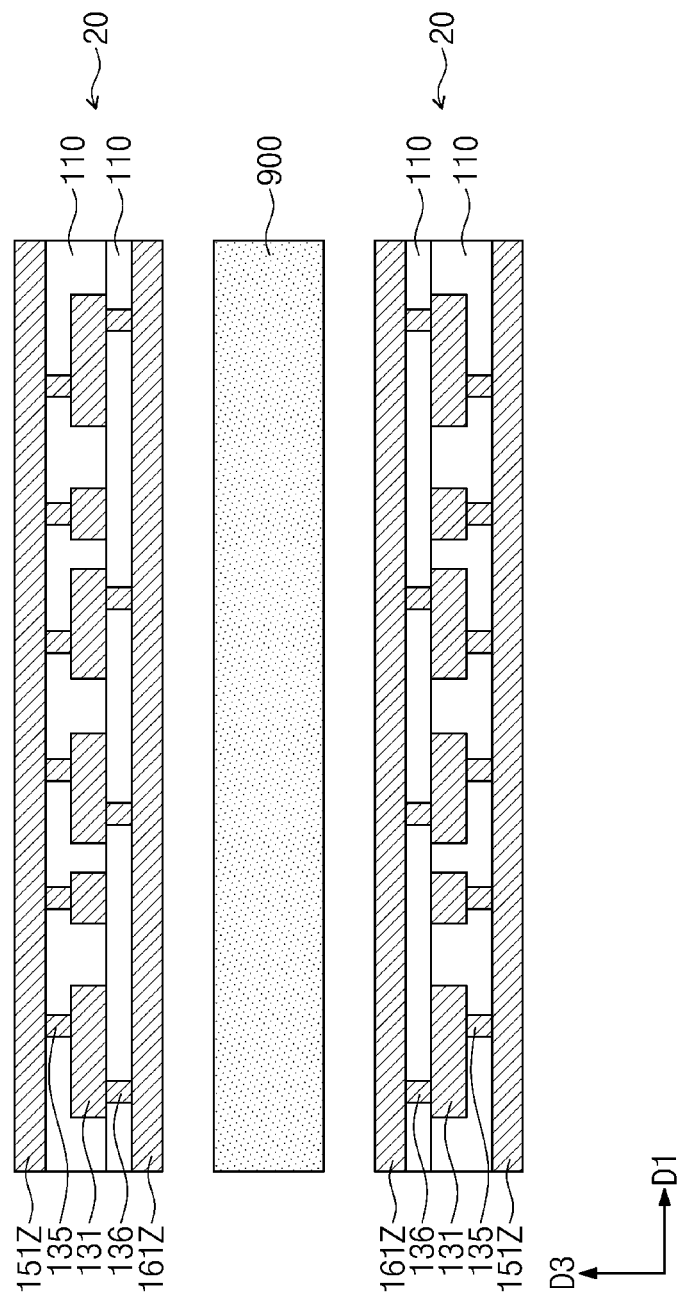

Referring to FIG. 4C, the preliminary substrates 20 may be separated from the temporary substrate 900.

Figure 4D:
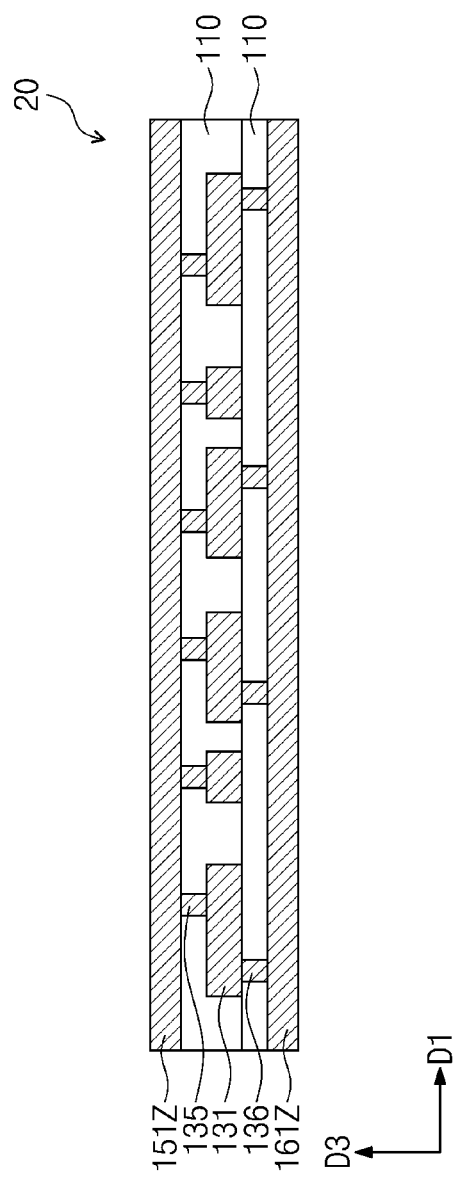

Referring to FIG. 4D, one of the separated preliminary substrates 20 is shown.

Figure 4E:
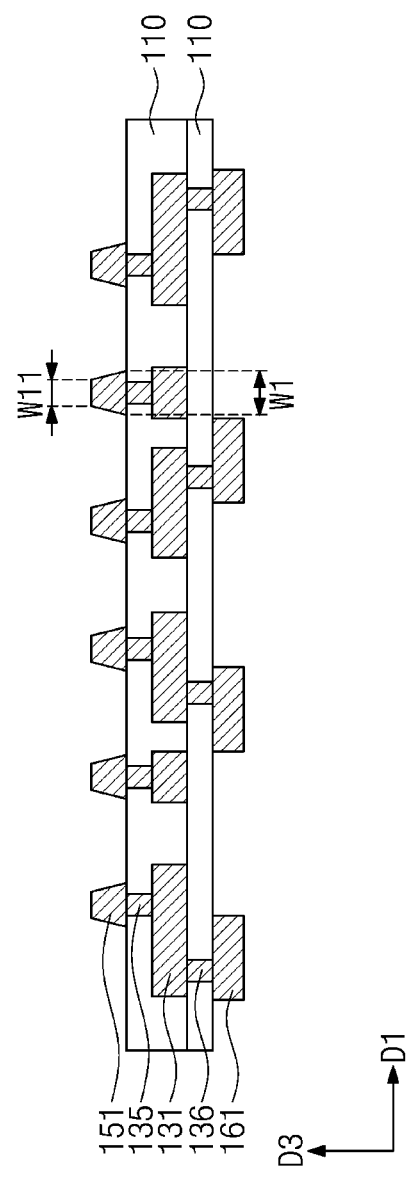

Referring to FIG. 4E, using one of the separated preliminary substrates 20 as an example, the first conductive layer 151Z may undergo a patterning process, and the second conductive layer 161Z may undergo a patterning process. The patterning process of the first conductive layer 151Z and the patterning process of the second conductive layer 161Z may be performed in a single or multiple steps.

The first conductive layer 151Z may be patterned to form a plurality of first conductive patterns 151. The patterning process of the first conductive layer 151Z may include an etching process. The patterning process of the first conductive layer 151Z may further include exposure and development processes. The etching process may include a wet etching process. An upper portion of each of the first conductive patterns 151 may be exposed to the etching process earlier than a lower portion of each of the first conductive patterns 151, and thus each of the first conductive patterns 151 may have a trapezoidal shape. Therefore, each of the first conductive patterns 151 may have a width W11 at its top surface less than a first width W1 at its bottom surface. The first conductive patterns 151 may be correspondingly coupled to the first conductive vias 135. The first conductive patterns 151 may be laterally spaced apart and electrically separated from each other.

The second conductive layer 161Z may be patterned to form a plurality of lower conductive patterns 161. The patterning process of the second conductive layer 161Z may include an etching process. The patterning process of the second conductive layer 161Z may further include exposure and development processes. The etching process may include a wet etching process. Differently from that shown, each of the lower conductive patterns 161 may have a width at its top surface greater than a width at its bottom surface. The lower conductive patterns 161 may be correspondingly coupled to the second conductive vias 136. The lower conductive patterns 161 may be laterally spaced apart and electrically separated from each other.

Figure 4F:
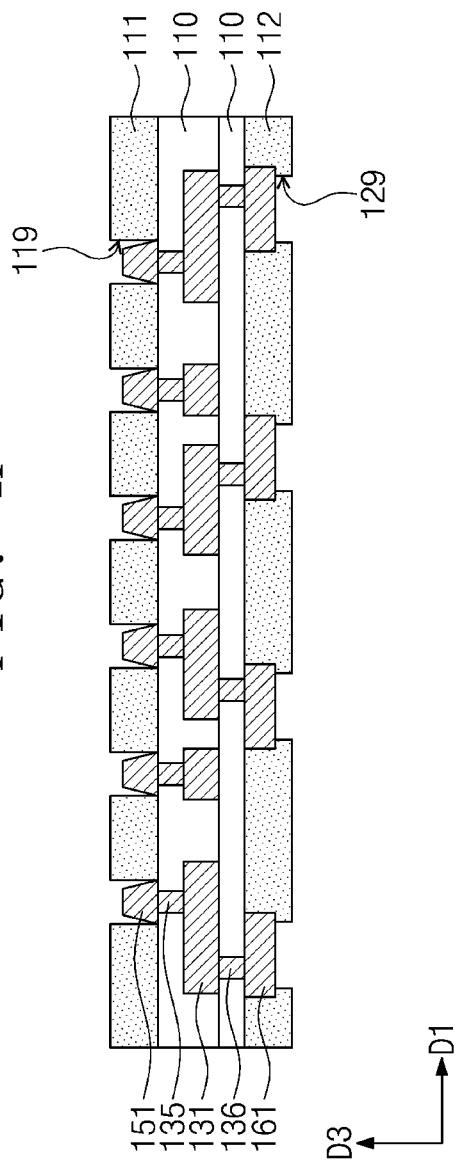

Referring to FIG. 4F, an upper protection layer 111 may be formed on a top surface of an uppermost dielectric layer 110. The formation of the upper protection layer 111 may include coating a solder resist material. First holes 119 may be formed in the upper protection layer 111 to expose the first conductive patterns 151.

A lower protection layer 112 may be formed on a bottom surface of a lowermost dielectric layer 110. The formation of the lower protection layer 112 may include coating a solder resist material. Second holes 129 may be formed on the lower protection layer 112 to expose the lower conductive patterns 161.

Figure 4G:
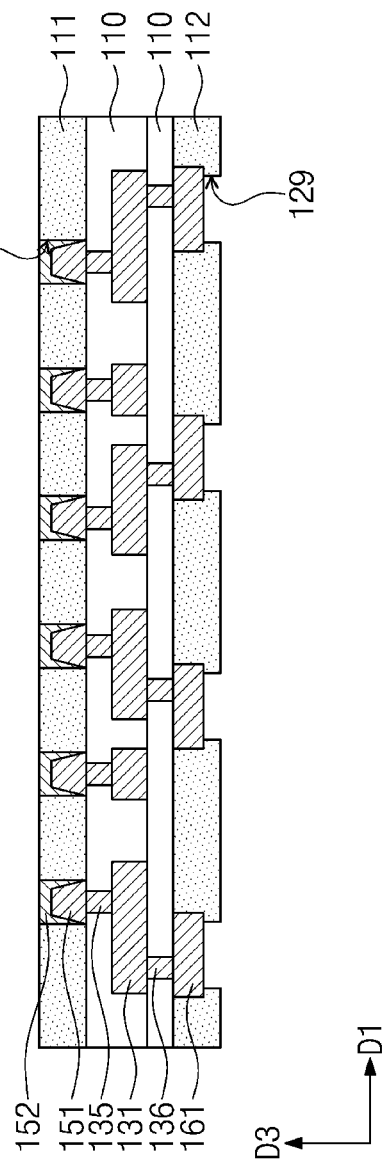

Referring to FIG. 4G, the first conductive patterns 151 may undergo a plating process to form a plurality of second conductive patterns 152. The second conductive patterns 152 may cover top and lateral surfaces of the first conductive patterns 151. The plating process may include an electroplating process or a chemical plating process.

The lower conductive patterns 161 may not be exposed to the plating process. For another example, a plating process may further be processed on the lower conductive patterns 161. In this case, additional lower conductive patterns (not shown) may further be formed on bottom surfaces of the lower conductive patterns 161.

Referring back to FIG. 2A, a plurality of intermediate layers 155 may be correspondingly formed on the second conductive patterns 152. The intermediate layers 155 may be laterally spaced apart from each other. A plurality of bonding layers 157 may be formed on the intermediate layers 155 to cover top surfaces and sidewalls of the intermediate layers 155. A plating process may be performed to form the bonding layers 157. The bonding layers 157 may be disposed laterally spaced apart from each other. Therefore, upper bonding pads 150 may be fabricated. The upper bonding pads 150 may include the first conductive patterns 151, the second conductive patterns 152, the intermediate layers 155, and the bonding layers 157.

A plurality of lower intermediate layers 165 may be formed on the lower conductive patterns 161 and in the second holes 129. The lower intermediate layers 165 and the intermediate layers 155 may be formed in a single process or in individual processes. A plurality of lower bonding layers 167 may be formed on the lower intermediate layers 165 and in the second holes 129. The lower bonding layers 167 and the bonding layers 157 may be formed in a single process or in individual processes. Therefore, lower pads 160 may be fabricated. The lower pads 160 may include the lower conductive patterns 161, the lower intermediate layers 165, and the lower bonding layers 167. Through the aforementioned exemplary processes, a substrate 100 may be eventually fabricated.

Subsequently, as shown in FIG. 3B, a semiconductor chip 200 may be disposed on the substrate 100, and bonding wires may be connected to the semiconductor chip 200 via chip pads 250 and may be connected to the substrate 100 via the upper bonding pads 150. The bonding of wires to the pads may be performed using known bonding techniques, for example, using pressure, heat, ultrasonic energy, etc. Additional steps may be performed, as described previously, to result in the semiconductor package 10 shown in FIG. 3B.

According to the present inventive concepts, upper bonding pads may each include a first conductive pattern, a second conductive pattern, an intermediate layer, and a bonding layer. The presence of the second conductive pattern may cause the upper bonding pads to have a fine pitch. An upper protection layer may cover a sidewall of the second conductive pattern to prevent an electrical short between the upper bonding pads. Bonding wires may be prevented from an electrical short, and may each be adequately bonded to a corresponding bonding layer.

This detailed description of the present inventive concepts should not be construed as limited to the embodiments set forth herein, and it is intended that the present inventive concepts cover the various combinations, the modifications and variations of this invention without departing from the spirit and scope of the present inventive concepts. The appended claims should be construed to include other embodiments.

Spatially relative terms, such as "beneath," "below," "lower," "above," "upper," "top," "bottom," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

What is claimed is:

1. A semiconductor package, comprising:
   a substrate that includes an upper protection layer and a plurality of upper bonding pads;
   a semiconductor chip on the substrate; and
   a plurality of bonding wires connected to the semiconductor chip and the upper bonding pads,
   wherein each of the upper bonding pads includes:
      a first conductive pattern;
      a second conductive pattern that covers a top surface and a sidewall of the first conductive pattern and includes a metal element the same as a metal element of the first conductive pattern; and
      a bonding layer on the second conductive pattern,
   wherein a width of the top surface of the first conductive pattern is less than a width of a bottom surface of the first conductive pattern, and
   wherein the upper protection layer covers sidewalls of the second conductive pattern.

2. The semiconductor package of claim 1, wherein a width of a top surface of the second conductive pattern is about 90% to about 110% of the width of the bottom surface of the first conductive pattern.

3. The semiconductor package of claim 1, wherein each of the upper bonding pads further includes an intermediate layer between the second conductive pattern and the bonding layer,
   wherein the intermediate layer includes a metal element different from the metal element of the second conductive pattern and different from a metal element of the bonding layer.

4. The semiconductor package of claim 3, wherein the bonding layer covers a top surface and a sidewall of the intermediate layer.

5. The semiconductor package of claim 1, wherein a width of the bonding layer is the same as or greater than a width of a top surface of the second conductive pattern.

6. The semiconductor package of claim 5, wherein
   a pitch of the upper bonding pads is in a range of about 40 μm to about 60 μm, and
   the width of the bonding layer is in a range of about 20 μm to about 33 μm.

7. The semiconductor package of claim 1, wherein the bonding layer extends onto a top surface of the upper protection layer.

8. The semiconductor package of claim 1, wherein a grain size of the second conductive pattern is different from a grain size of the first conductive pattern.

9. The semiconductor package of claim 1, wherein the bonding layer includes a metal different from a metal of the first conductive pattern and different from a metal of the second conductive pattern.

10. The semiconductor package of claim 1, wherein
    each of the upper bonding pads further includes an intermediate layer between the second conductive pattern and the bonding layer,
    the first conductive pattern and the second conductive pattern include copper,
    the intermediate layer includes nickel,
    the bonding layer includes gold, and
    the upper protection layer includes a solder resist material.

11. The semiconductor package of claim 1, wherein the first conductive pattern and second conductive pattern are formed in openings in the upper protection layer.

12. A semiconductor package, comprising a substrate that includes an upper protection layer and an upper bonding pad,
    wherein the upper bonding pad includes:
       a first conductive pattern;
       a second conductive pattern on the first conductive pattern; and
       a bonding layer on the second conductive pattern,
    wherein a width of a top surface of the first conductive pattern is less than a width of a bottom surface of the first conductive pattern,
    wherein the second conductive pattern covers a sidewall and the top surface of the first conductive pattern,
    wherein the upper bonding pad further includes an intermediate layer on the first conductive pattern,
    wherein the bonding layer covers a top surface and a sidewall of the intermediate layer, and
    wherein the upper protection layer covers sidewalls of the second conductive pattern.

13. The semiconductor package of claim 12, wherein a width of the bonding layer is about 100% to about 120% of the width of the top surface of the second conductive pattern.

14. The semiconductor package of claim 12, further comprising:
    a semiconductor chip on a top surface of the substrate, the semiconductor chip including a chip pad; and
    a bonding wire electrically connected to the chip pad and the upper bonding pad,
    wherein the bonding wire contacts the bonding layer.

15. The semiconductor package of claim 12, wherein a width of a top surface of the second conductive pattern is about 90% to about 110% of the width of the bottom surface of the first conductive pattern.

16. The semiconductor package of claim 12, wherein
    the second conductive pattern includes a metal element the same as a metal element of the first conductive pattern, and
    the intermediate layer includes a metal element different from the metal element of the second conductive pattern and different from a metal element included in the bonding layer.

17. A semiconductor package, comprising:
    a substrate, including:

a dielectric structure that includes a plurality of stacked dielectric layers,
a wiring line between the dielectric layers,
a lower pad disposed on a bottom surface of the dielectric structure and electrically connected to the wiring line,
an upper bonding pad disposed on a top surface of the dielectric structure and electrically connected to the wiring line, and
an upper protection layer on the top surface of the dielectric structure;
a solder ball on a bottom surface of the lower pad;
a semiconductor chip on a top surface of the substrate;
a bonding wire connected to the semiconductor chip and the upper bonding pad; and
a molding layer on the substrate, the molding layer covering the semiconductor chip and the bonding wire,
wherein the upper bonding pad includes:
a first conductive pattern;
a second conductive pattern on a top surface of the first conductive pattern, the second conductive pattern including a first metal element the same as a metal element of the first conductive pattern;
an intermediate layer on a top surface of the second conductive pattern, the intermediate layer including a second metal element different from the first metal element; and
a bonding layer on a top surface of the intermediate layer, the bonding layer including a third metal element different from the first metal element and different from the second metal element,
wherein a width of the top surface of the first conductive pattern is less than a width of a bottom surface of the first conductive pattern, and
wherein the upper protection layer covers a sidewall of the second conductive pattern.

18. The semiconductor package of claim 17, wherein the second conductive pattern covers a sidewall of the first conductive pattern.

19. The semiconductor package of claim 17, wherein
a width of the top surface of the second conductive pattern is about 90% to about 110% of the width of the bottom surface of the first conductive pattern, and
a width of the bonding layer is the same as or greater than the width at the top surface of the second conductive pattern.

20. The semiconductor package of claim 17, wherein
the upper bonding pad is one of a plurality of bonding pads that are laterally spaced apart from each other,
an interval between the upper bonding pads is in a range of about 10 μm to about 20 μm,
the width of the bottom surface of the first conductive pattern is in a range of about 17 μm to about 30 μm, and
a width of the bonding layer is in a range of about 20 μm to about 33 μm.

* * * * *